(12) United States Patent
Katagiri

(10) Patent No.: US 7,308,667 B2
(45) Date of Patent: Dec. 11, 2007

(54) LSI PHYSICAL DESIGNING METHOD, PROGRAM, AND APPARATUS

(75) Inventor: Hideaki Katagiri, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 324 days.

(21) Appl. No.: 11/062,594

(22) Filed: Feb. 22, 2005

(65) Prior Publication Data
US 2006/0117288 A1    Jun. 1, 2006

(30) Foreign Application Priority Data
Nov. 29, 2004   (JP) ............................. 2004-343338

(51) Int. Cl.
*G06F 17/50* (2006.01)
(52) U.S. Cl. .................... 716/8; 716/9; 716/10; 716/11
(58) Field of Classification Search ............... 716/8–11
See application file for complete search history.

(56) References Cited

U.S. PATENT DOCUMENTS

| | | | | |
|---|---|---|---|---|
| 4,777,606 | A | * | 10/1988 | Fournier ...................... 716/12 |
| 5,341,383 | A | * | 8/1994 | Shikatani et al. ............ 714/724 |
| 5,742,086 | A | * | 4/1998 | Rostoker et al. ............ 257/300 |
| 5,808,898 | A | * | 9/1998 | Kajitani et al. ................ 716/9 |
| 5,870,312 | A | * | 2/1999 | Scepanovic et al. .......... 716/10 |
| 6,002,857 | A | * | 12/1999 | Ramachandran ............. 716/14 |
| 6,014,507 | A | * | 1/2000 | Fujii ........................... 716/12 |
| 6,049,659 | A | * | 4/2000 | Matsumoto et al. ............ 716/1 |
| 6,080,206 | A | | 6/2000 | Tadokoro et al. |
| 6,378,121 | B2 | * | 4/2002 | Hiraga ........................ 716/13 |
| 6,584,603 | B1 | * | 6/2003 | Shibuya .......................... 716/8 |
| 6,779,167 | B2 | * | 8/2004 | Igarashi et al. ............... 716/13 |

(Continued)

FOREIGN PATENT DOCUMENTS

JP          5-160375        6/1993

(Continued)

OTHER PUBLICATIONS

Curatelli, F et al. "An algorithm for the definition of routing regions in VLSI design" Circuits and Systems, 1990., Proceedings of the 33rd Midwest Symposium on Aug. 12-14, 1990 pp. 184-187, vol. 1 □□.*

*Primary Examiner*—Thuan Do
*Assistant Examiner*—Naum Levin
(74) *Attorney, Agent, or Firm*—Staas & Halsey LLP

(57) ABSTRACT

In addition to a rectangular shape, a non-rectangular shape is enabled to be handled as a physical design unit, thereby miniaturizing a chip and reducing the costs. A floor plan processing unit forms a floor plan for arranging a plurality of circuit blocks including a non-rectangular area into the chip. A layout processing unit divides each of a plurality of non-rectangular circuit blocks having non-rectangular areas into a plurality of rectangular areas and arranges them into the chip so as to be adapted to the floor plan. A wiring processing unit mutually wires the plurality of circuit blocks. The non-rectangular area is constructed by a set of a plurality of division rectangular areas and has a data structure showing a set of two-dimensional coordinate values indicating diagonal vertices of the plurality of division rectangular areas. The non-rectangular areas are also introduced with respect to the cells which are arranged in the circuit block.

18 Claims, 15 Drawing Sheets

U.S. PATENT DOCUMENTS

| | | | |
|---|---|---|---|
| 6,831,356 B2* | 12/2004 | Terada et al. | 257/691 |
| 6,859,916 B1* | 2/2005 | Teig et al. | 716/13 |
| 7,222,322 B1* | 5/2007 | Chyan et al. | 716/12 |
| 2002/0162079 A1* | 10/2002 | Igarashi et al. | 716/2 |
| 2003/0212976 A1* | 11/2003 | Drumm | 716/12 |
| 2004/0019862 A1* | 1/2004 | Li et al. | 716/5 |
| 2004/0243964 A1* | 12/2004 | McElvain et al. | 716/12 |

FOREIGN PATENT DOCUMENTS

| | | |
|---|---|---|
| JP | 5-181936 | 7/1993 |
| JP | 5-243383 | 9/1993 |
| JP | 6-124321 | 5/1994 |
| JP | 9-147009 | 6/1997 |
| JP | 10-189746 | 7/1998 |
| JP | 2003-303217 | 10/2003 |

* cited by examiner

FIG. 4A
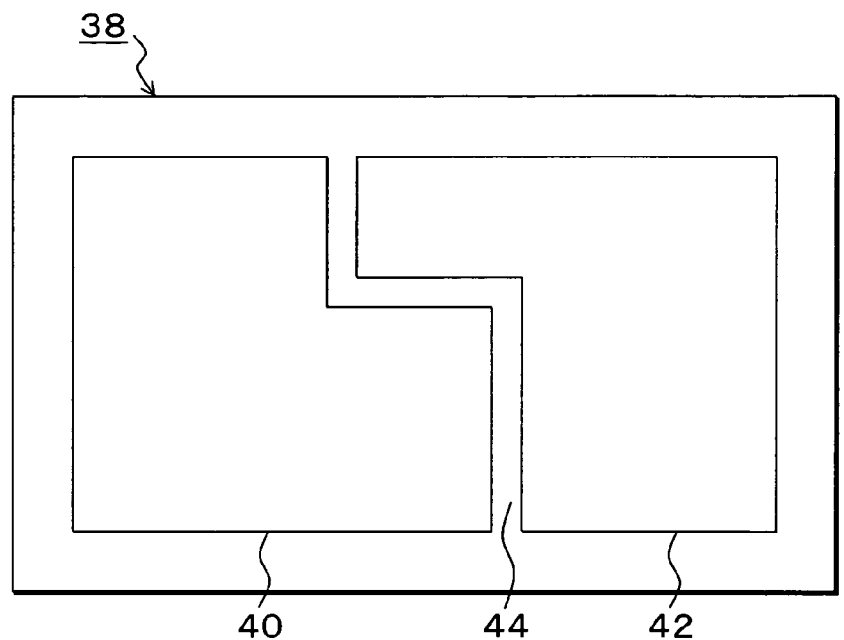
FIG. 4B
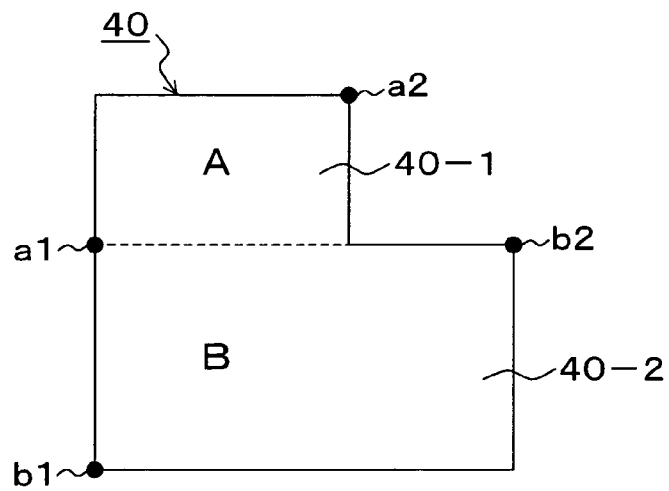
FIG. 4C
NON-RECTANGULAR AREA {A(a1,a2), B(b1,b2)}

LSI PHYSICAL DESIGNING METHOD, PROGRAM, AND APPARATUS

This application is a priority based on prior application No. JP 2004-343338, filed on Nov. 29, 2004, in Japan.

BACKGROUND OF THE INVENTION

1. Field of the Invention

The invention relates to LSI physical designing method, program, and apparatus for making a layout design by a layout and wiring of circuit blocks and cells on the basis of a floor plan and, more particularly, to LSI physical designing method, program, and apparatus in which a non-rectangular area is handled as a physical design unit such as circuit block, cell, or the like.

2. Description of the Related Arts

In recent years, in an LSI designing system, a gate scale to a chip size has been increasing due to the realization of advanced functions. In a layout design known as an LSI physical design for converting a designed circuit diagram into a layout wiring of a device having a physical shape and dimensions, an efficient using method of a chip shape is demanded. In the conventional layout design, a layer layout design in which the circuit diagram is separated into layers such as chip, circuit block, and cell and designing operations are executed in parallel is generalized. In such a layer layout design, only a rectangular area is handled as a shape of a physical design unit of a lower layer such as circuit block or cell.

Refer to JP-A-5-181936, JP-A-6-124321, JP-A-5-160375, JP-A-5-243383, JP-A-9-147009, JP-A-10-189746, and JP-A-2003-303217.

However, in such a conventional layer layout design, since only a rectangular area is permitted as a physical design unit such as circuit block, cell, or the like, for example, in the case where the cells are arranged in the rectangular area of the circuit block, the cells are not always uniformly distribution-arranged in the rectangular area and there is such a problem that a dead space in which a cell layout or wiring is not locally performed is liable to occur.

SUMMARY OF THE INVENTION

According to the invention, there are provided LSI physical designing method, program, and apparatus in which in addition to a rectangular area, a non-rectangular area is enabled to be handled as a physical design unit, thereby miniaturizing a chip and reducing the costs.

The invention provides an LSI physical designing method. The LSI physical designing method of the invention comprises:

a floor plan processing step wherein a floor plan for arranging a plurality of circuit blocks including a circuit block (non-rectangular circuit blocks) of a non-rectangular area into a chip is formed;

a layout step wherein the circuit block of the non-rectangular area, for example, the non-rectangular circuit block is divided into a plurality of division rectangular areas and they are arranged in the chip so as to be adapted to the floor plan; and a wiring step wherein the plurality of circuit blocks including the circuit block of the non-rectangular area are mutually wired.

The non-rectangular area serving as a physical design unit is constructed by a set of the plurality of division rectangular areas and has a data structure showing a set of two-dimensional coordinate values indicating diagonal vertices of the plurality of division rectangular areas.

In the floor plan processing step, after the plurality of circuit blocks of the rectangular areas are arranged in the chip, a pair of adjacent circuit blocks having empty areas are searched, a self rectangular empty area is deleted from a part of an opposite side of one of said circuit blocks, a self rectangular empty area is deleted from a residual portion of an opposite side of the other circuit block, and a pair of non-rectangular areas having concave/convex fitting shapes are formed.

In the floor plan processing step, after the plurality of circuit blocks of the rectangular areas are arranged in the chip, a pair of adjacent circuit blocks having a jammed area and an empty area are searched, a rectangular area is added to a part of an opposite side of the circuit block having the jammed area, a shape corresponding to the added rectangular area is deleted from a portion of an opposite side of the circuit block having the empty area, and a pair of non-rectangular areas having concave and convex fitting shapes are formed.

In the layout step, the non-rectangular area is handled as a set of a plurality of division rectangular areas, in the case where at least one of the plurality of division rectangular areas overlaps the division rectangular area of another non-rectangular area, it is determined that the two non-rectangular areas overlap each other, and the overlap is eliminated by re-layout.

In the LSI physical designing method of the invention, the method further has a cell layout step wherein cells are arranged in the circuit block of the non-rectangular area, in this cell layout step, when the arranged cells are included in one or a plurality of division rectangular areas, it is determined that they are included in the non-rectangular area, and when the arranged cells are not included in any one of the plurality of division rectangular areas or a part of the cells are included in the division rectangular area, it is determined that the cells are not included in the non-rectangular area.

In the layout step, the cells having the non-rectangular areas are further arranged in the circuit block.

The invention provides an LSI physical designing program. The LSI physical designing program allows a computer to execute:

a floor plan processing step wherein a floor plan for arranging a plurality of circuit blocks including a circuit block of a non-rectangular area into a chip is formed;

a layout step wherein the circuit block of the non-rectangular area is divided into a plurality of rectangular areas and they are arranged in the chip so as to be adapted to the floor plan; and a wiring step wherein the plurality of circuit blocks including the circuit block having the non-rectangular area are mutually wired.

The invention provides an LSI physical designing apparatus. The LSI physical designing apparatus comprises:

a floor plan processing unit which forms a floor plan for arranging a plurality of circuit blocks including a circuit block of a non-rectangular area into a chip;

a layout processing unit which divides the circuit block having the non-rectangular area into a plurality of rectangular areas and arranges the rectangular areas into the chip so as to be adapted to the floor plan; and a wiring processing unit which mutually wires the plurality of circuit blocks including the circuit block having the non-rectangular area.

Details of the physical designing program and apparatus of the invention are fundamentally the same as those in the case of the LSI physical designing method of the invention.

According to the invention, in addition to the conventional rectangular area, the non-rectangular area constructed by the set of a plurality of division rectangular areas can be handled as a shape of the physical design unit such as circuit block or cell in the layer layout design. Therefore, for example, when a dead space occurs in the adjacent circuit blocks of the rectangular areas, by deleting the rectangular areas having the areas corresponding to the dead spaces and, thereafter, allowing them to face each other in such a manner that their concave and convex shapes face alternately with respect to each circuit block, a chip area can be reduced and the manufacturing costs can be decreased.

By using the non-rectangular area as a set of the divided rectangular areas, the process for the conventional rectangular area can be used as it is even in the case of the non-rectangular area, and the handling of the physical design unit serving as a non-rectangular area in the existing layer layout design can be easily realized. Further, as for the non-rectangular area, by introducing the handling as a non-rectangular area with respect to not only the circuit block but also the cells which are arranged in the circuit block, the dead space occurring in the chip can be reduced and the area of the circuit block can be decreased.

Moreover, in the case where the wiring jammed area exists locally in one of the pair of circuit blocks having the rectangular areas and the empty area exists locally in the other circuit block, by adding the rectangular area to the circuit block having the jammed area and enlarging the area and, at the same time, by deleting the enlarged rectangular area from the circuit block having the empty area and reducing the area, the circuit block is changed to the non-rectangular area and an error caused by the wiring jam in the circuit block of the rectangular area can be eliminated by the change to the non-rectangular area.

The above and other objects, features, and advantages of the present invention will become apparent from the following detailed description with reference to the drawings.

BRIEF DESCRIPTION OF THE DRAWINGS

FIGS. 4A to 4C are explanatory diagrams of a layout in which circuit blocks each having a non-rectangular area according to the invention are arranged;

DETAILED DESCRIPTION OF THE PREFERRED EMBODIMENT

Figure 1:
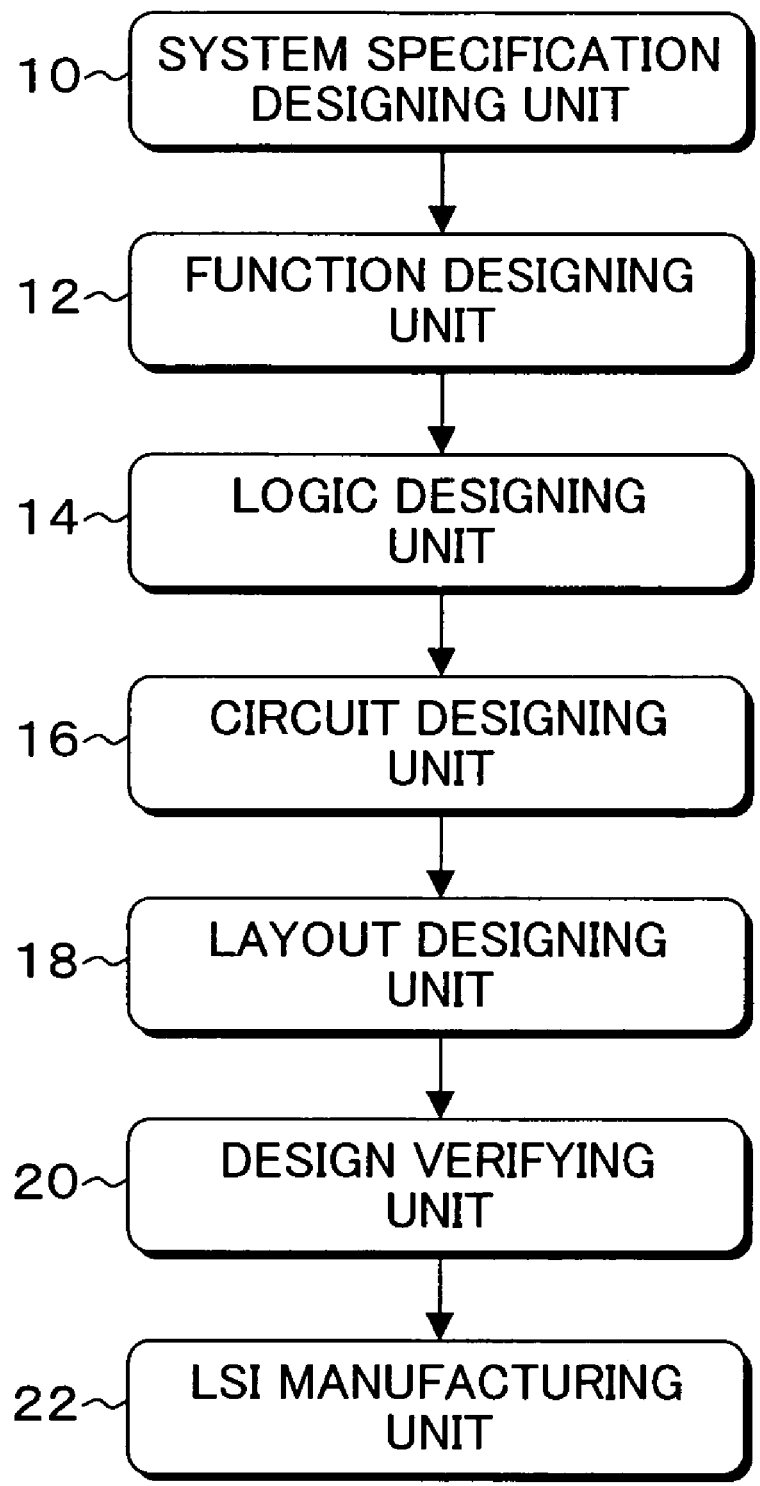
FIG. 1 is a block diagram of a whole construction of an LSI design system.

FIG. 1 is a block diagram of a whole construction of an LSI design system to which an LSI physical designing method of the invention is applied. In FIG. 1, the LSI design system is constructed by: a system specification designing unit 10; a function designing unit 12; a logic designing unit 14; a circuit designing unit 16; a layout designing unit 18; a design verifying unit 20; and an LSI manufacturing unit 22. The system specification designing unit 10 determines into which functional blocks the whole system is divided and how it operates in order to realize a target system specification of an LSI. An operation simulator or a system simulator is used to examine validity of a design result.

The function designing unit 12 makes a design at a register transfer level (RT level) for deciding an internal structure and the operation of the functional block. A function simulator is used to verify the design result. The logic designing unit 14 designs a logic circuit at a gate level. A logic simulator, a timing simulator, or the like is used to confirm the operation. The circuit designing unit 16 designs a transistor circuit. A circuit simulator is used to examine characteristics of the designed circuit. The layout designing unit 18 makes a physical design for converting a circuit diagram into a layout wiring of a device having a physical shape and dimensions and forms a mask layout. A method of a layer layout design is ordinarily used. After a plurality of circuit blocks are arranged in a chip in accordance with a floor plan, wiring among the blocks is performed and a cell layout and wiring are executed in parallel with respect to the plurality of circuit blocks. A layout wiring program corresponding to an automatic design or the like is used for the layout and wiring of the cells.

In the invention, as a shape of a layer module of a lower layer which is arranged in the chip in the layout designing unit 18, specifically speaking, as a shape of the circuit block, in addition to the conventional rectangular area, a non-rectangular area is newly introduced and handled.

The design verifying unit 20 executes the following processes: a design rule check (DRC) to examine a rule violation of the design dimensions with respect to the designed layout; a line connection check to examine a circuit extraction and line connecting algorithm for forming circuit line connection information from the layout; an electric rule check to examine dimension requesting characteristics of the transistor, the presence or absence of a short-circuit of a power wiring; and the like. When the processes of the design verifying unit 20 are finished, mask data is formed and transferred to the LSI manufacturing unit 22 and the LSI is manufactured.

Figure 2:
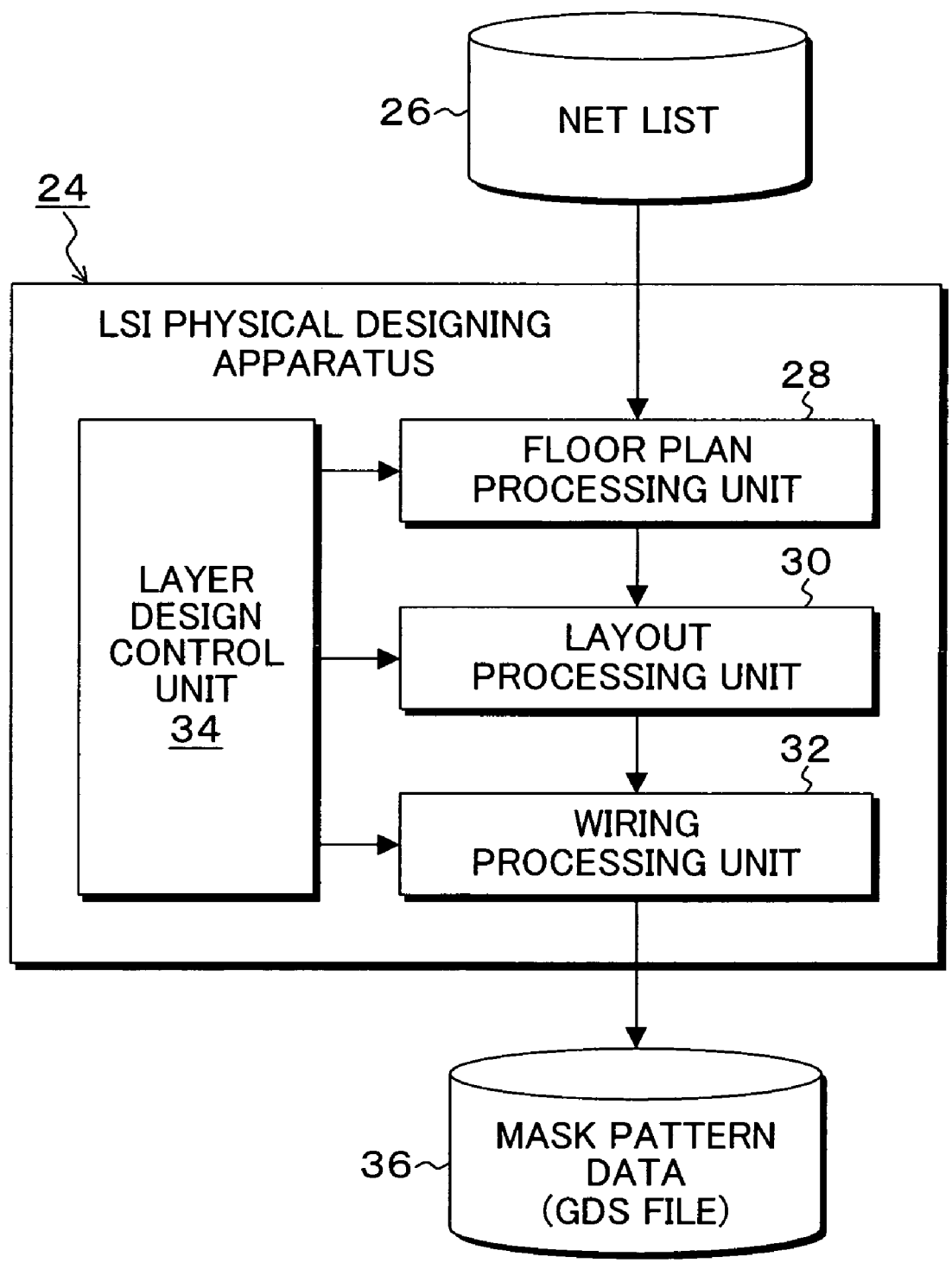
FIG. 2 is a block diagram of a functional construction of an LSI physical designing apparatus according to the invention.

FIG. 2 is a block diagram of a functional construction of an LSI physical designing apparatus according to the invention. A net list 26 is provided for an LSI physical designing apparatus 24 according to the invention. Net list data obtained after the design is finished in the circuit designing unit 16 shown in FIG. 1 has been stored in the net list 26. The LSI physical designing apparatus 24 is constructed by: a floor plan processing unit 28; a layout processing unit 30; a wiring processing unit 32; and a layer design control unit 34. Layout design data obtained after the process is finished in the LSI physical designing apparatus 24 is outputted as mask pattern data 36 after the design verification.

The floor plan processing unit 28 provided in the LSI physical designing apparatus 24 forms a floor plan for arranging a plurality of circuit blocks including a non-rectangular area into the chip. The layout processing unit 30 arranges the circuit blocks into the chip so as to be adapted to the floor plan. In this case, with respect to the circuit block having the non-rectangular area, each of the plurality of circuit blocks is divided into a plurality of rectangular areas and arranged in the chip. The wiring processing unit 32 mutually wires the plurality of circuit blocks arranged in the chip. Further, the layout processing unit 30 and the wiring processing unit 32 arrange and wire the cells with respect to each of the circuit blocks arranged in the chip. In the invention, with respect to the cells which are arranged in the circuit block as well, in addition to the cells each having the conventional rectangular area, the cell having the non-rectangular area can be also newly arranged according to the invention.

The layer design control unit 34 realizes the method of the layer layout design by the LSI physical designing apparatus 24. In the layer layout design of the LSI, first, how to arrange the circuit blocks each serving as a physical design unit of the lower layer into the chip is determined by the floor plan processing unit 28 by presuming a flow of the data and a physical size of each circuit block. That is, the floor plan is a problem for arranging the (n) given blocks into the rectangular chip with the minimum area without overlapping each other. According to the invention, in this floor plan, in addition to the conventional circuit block having the rectangular area, the circuit block having the non-rectangular area can be handled. The non-rectangular area which is handled in the invention is constructed by a set of a plurality of division rectangular areas. Since the non-rectangular area in the invention is constructed by the set of a plurality of division rectangular areas as mentioned above, with respect to the layout into the chip, by dividing it into the rectangular areas and handling them, the circuit block of the non-rectangular area can be processed in a manner similar to the conventional circuit block having the rectangular area.

After the floor plan for arranging the circuit blocks into the chip is formed by the floor plan processing unit 28, the layout is designed so as to have the terminal positions and shapes to which the floor plan is adapted with respect to each circuit block. The circuit blocks are arranged in the chip by the layout processing unit 30 and wired by the wiring processing unit 32.

There are two kinds of methods of a bottom-up type and a top-down type in the layer layout design. The layer layout design of the bottom-up type is a method whereby a shape, a power wiring, an external pin layout, and the like of each circuit block serving as a layer module are sequentially determined and the layout-completed modules are arranged into the chip. The layer layout design of the top-down type is a method whereby when the floor plan is formed, the shape and the external pin layout of each circuit block serving as a layer module are decided and, thereafter, the layout design is made in parallel at the chip level and the layer module level. According to the layer layout design of the top-down type, since the shape of the layer module is determined in a top-down manner, the layer module that is optimum to the chip can be formed.

In those layer layout design, since the layout design can be made on a unit basis of a layer module in which the number of gates is small, that is, on a circuit block unit basis, a processing time of the program is short and the layout design can be efficiently executed with a small memory area. In the ordinary layer layout design of the LSI, the layout design is made by two stages of the chip and the circuit blocks. However, in a layer layout design of a further large scale and high performance, there is also a case where the layer layout design is made by two stages of the chip, the sub-chips, and the blocks. With respect to the physical design unit of the lower layers in such a layer layout design, according to the invention, in addition to the conventional rectangular area, the non-rectangular area is introduced and can be handled.

Figure 3:
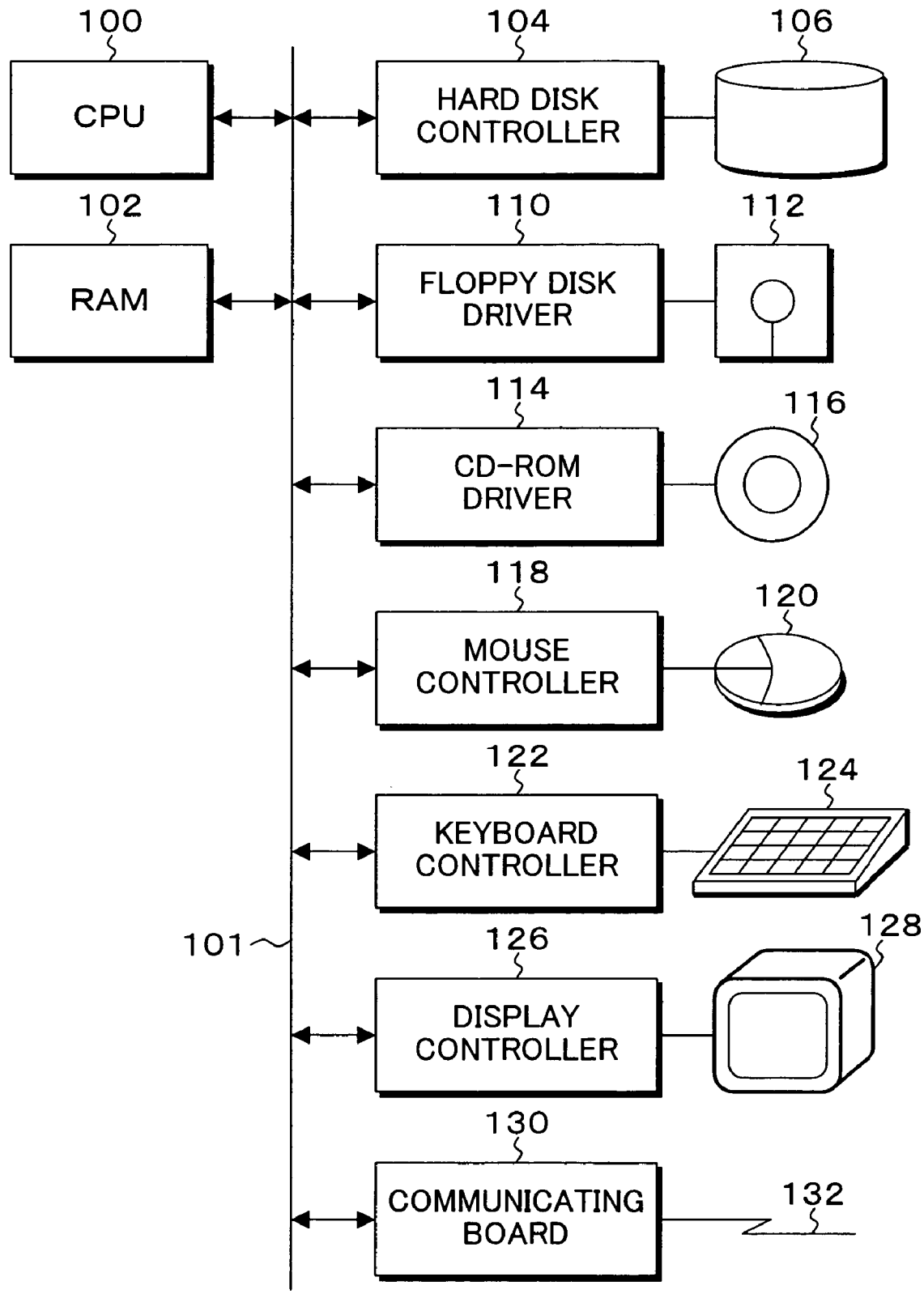
FIG. 3 is an explanatory diagram of a hardware environment of a computer to which the LSI physical designing apparatus of FIG. 2 is applied.

The LSI physical designing apparatus 24 in FIG. 2 is realized by, for example, hardware resources of a computer as shown in FIG. 3. In the computer in FIG. 3, a RAM 102, a hard disk controller (software) 104, a floppy disk driver (software) 110, a CD-ROM driver (software) 114, a mouse controller 118, a keyboard controller 122, a display controller 126, and a communicating board 130 are connected to a bus 101 of a CPU 100. A hard disk drive 106 is connected to the hard disk controller 104. Programs to execute the LSI physical designing process of the invention have been loaded in the hard disk controller 104. When the computer is activated, the necessary program is called from the hard disk drive 106, developed into the RAM 102, and executed by the CPU 100.

A floppy disk drive (hardware) 112 is connected to the floppy disk driver 110 and data can be written and read out into/from a floppy disk (registered trademark). A CD drive (hardware) 116 is connected to the CD-ROM driver 114 and data or programs stored in a CD can be read out. The mouse controller 118 transfers the inputting operation of a mouse 120 to the CPU 100. The keyboard controller 122 transfers the inputting operation of a keyboard 124 to the CPU 100. The display controller 126 allows a display unit 128 to display data. The communicating board 130 communicates with an external apparatus via a network by using a communicating line 132 including a wireless manner.

FIGS. 4A to 4C are explanatory diagrams of a layout in which circuit blocks having non-rectangular areas according to the invention are arranged in a chip. FIG. 4A shows the case where two non-rectangular circuit blocks 40 and 42 having areas and shapes formed on a chip 38 on the basis of the floor plan. A wiring area 44 having an area which is necessary and enough to connect the non-rectangular circuit blocks 40 and 42 is assured between them. The wiring area 44 depends on the number of wirings and the number of metal wiring layers which are used for wiring.

FIG. 4B shows the non-rectangular circuit block 40 extracted from FIG. 4A. As shown by a broken line, the non-rectangular circuit block 40 is constructed by a set of division rectangular areas 40-1 and 40-2 divided vertically. A data structure of the division rectangular area 40-1 is defined by two-dimensional coordinates of diagonal vertices a1 and a2. A data structure of the division rectangular area 40-2 is also defined by two-dimensional coordinates of diagonal vertices b1 and b2. Since the non-rectangular circuit block 40 is the set of the division rectangular areas 40-1 and 40-2, as shown in FIG. 4C, it can be expressed by the data structure Non-rectangular area {A(a1, a2), B(b1, b2)} of the two-dimensional coordinates showing the diagonal vertices (a1 and a2) and (b1 and b2).

Such a point that the non-rectangular circuit block 40 is constructed by the set of the division rectangular areas 40-1 and 40-2 is also similarly applied to the adjacent non-rectangular circuit block 42.

Figure 5A:
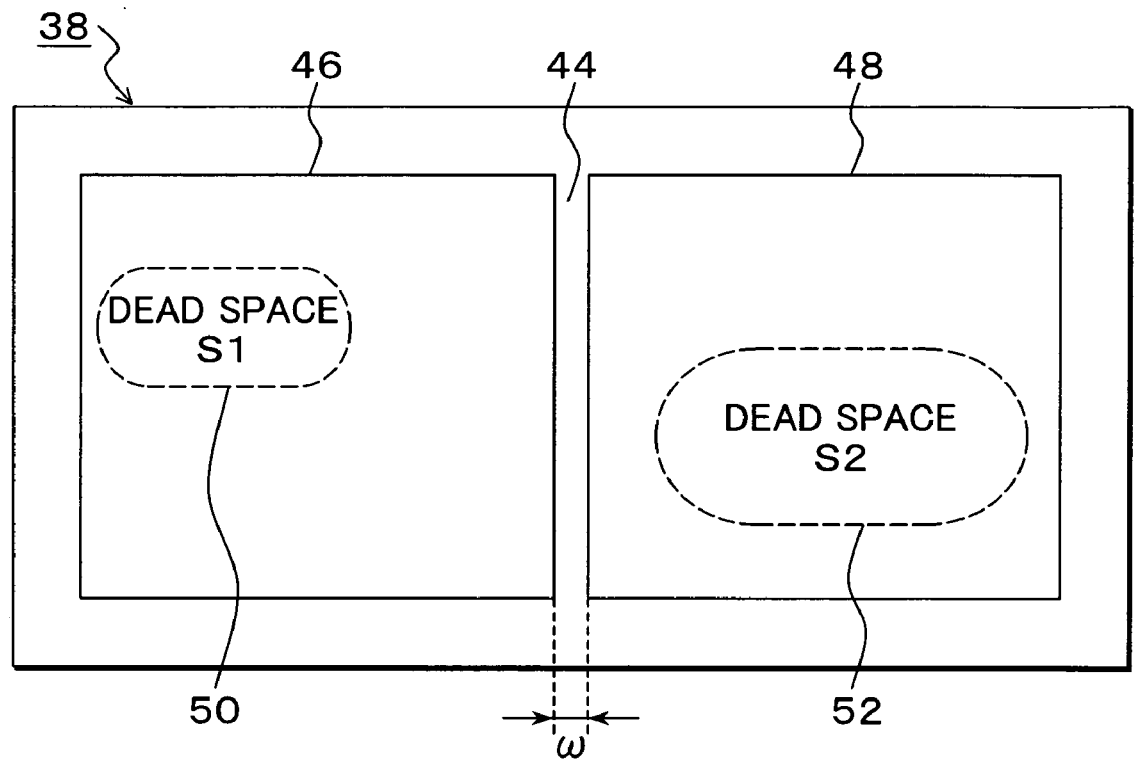
FIGS. 5A and 5B are layout explanatory diagrams of rectangular circuit blocks having dead spaces which are used to form the non-rectangular area according to the invention.
Figure 5B:
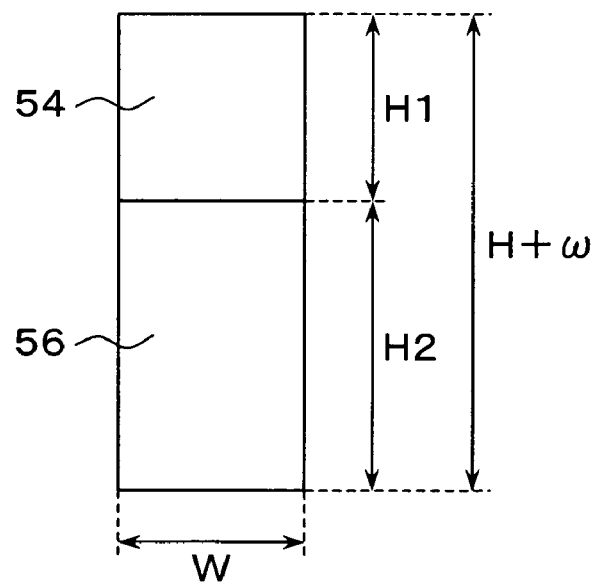

FIGS. 5A and 5B are layout explanatory diagrams of rectangular circuit blocks locally having dead spaces which are used to form the non-rectangular area according to the invention. FIG. 5A shows the case where rectangular circuit blocks 46 and 48 having rectangular areas are arranged in the chip 38 through the wiring area 44 on the basis of the floor plan. Dead spaces 50 and 52 exist locally in the rectangular circuit blocks 46 and 48, respectively. It is assumed that the dead space 50 has an area S1 and the dead space 52 has an area S2. With respect to the case where the adjacent rectangular circuit blocks 46 and 48 having the dead spaces 50 and 52 as mentioned above, a rectangular empty area corresponding to the area S1 of its own dead space 50 is deleted from a part of the opposite side of one adjacent rectangular circuit block 46 and a rectangular empty area corresponding to the area S2 of the dead space 52 is deleted from the residual portion of the opposite side of the other rectangular circuit block 48, thereby forming a pair of non-rectangular circuit blocks having non-rectangular shapes corresponding to concave and convex fitting shapes through the wiring area 44.

FIG. 5B shows an area and a size of a deletion rectangular area 54 to be deleted from the rectangular circuit block 46 and an area and a size of a deletion rectangular area 56 to be deleted from the rectangular circuit block 48. In FIG. 5B, the deletion rectangular areas 54 and 56 have a same lateral width W. As for a total height of them, since a width w of wiring area 44 is necessary between the concave and convex fitting shapes, the height is set to (H+w) obtained by adding the width w to heights H (H1, H2) of the rectangular circuit blocks 46 and 48. With respect to the rectangular area having the dimensions of the lateral width W×the height (H+w) as mentioned above, the lateral width W and the heights H1 and H2 of the deletion rectangular areas 54 and 56 are obtained by the following equations (1) to (3) so as to keep the total area (S1+S2) of the area S1 of the dead space 50 and the area S2 of the dead space 52.

Figure 6A:
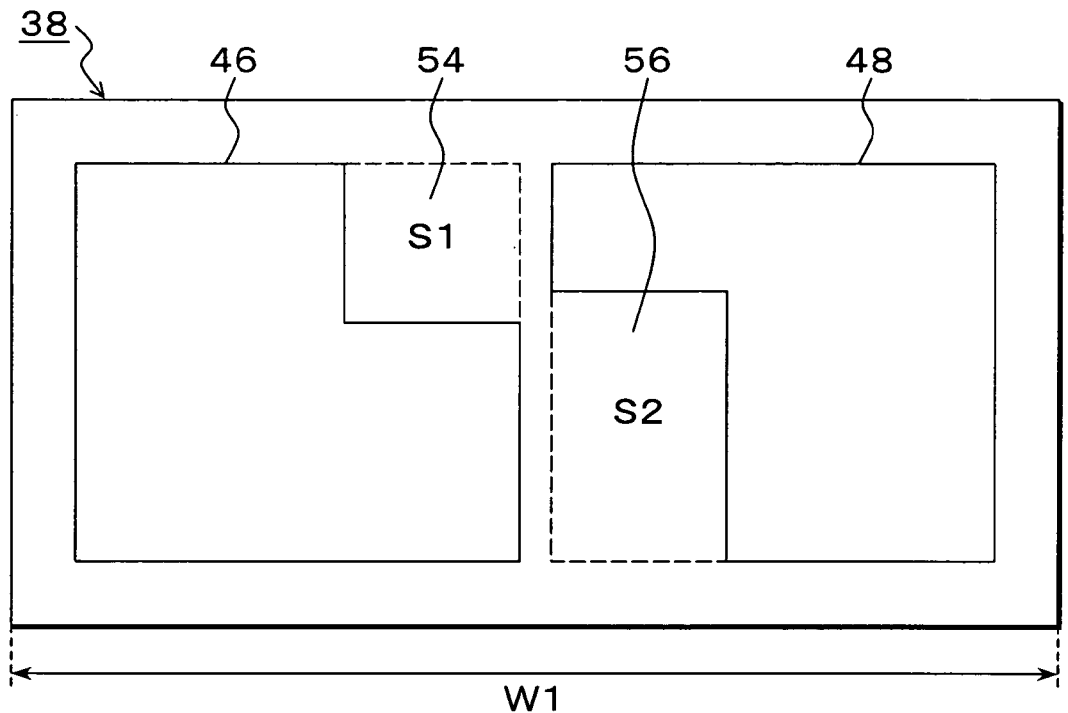
FIGS. 6A and 6B are layout explanatory diagrams of non-rectangular areas according to the invention formed on the basis of the dead spaces in FIGS. 5A and 5B.
Figure 6B:
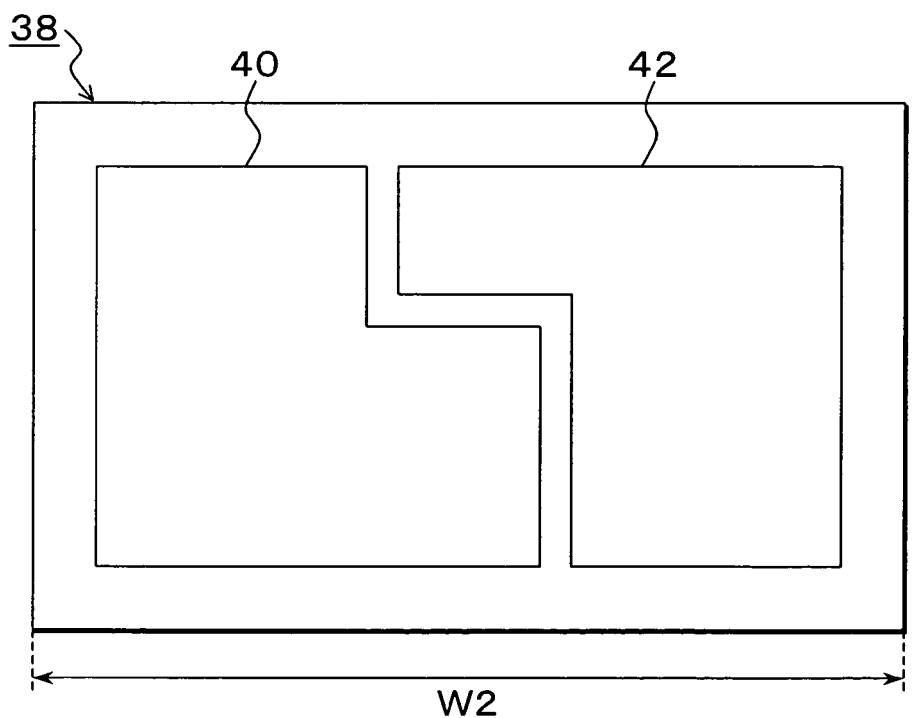

FIGS. 6A and 6B are explanatory diagrams of the circuit blocks having the non-rectangular areas according to the invention formed on the basis of the dead spaces in FIGS. 5A and 5B. In FIG. 6A, the deletion rectangular areas 54 and 56 having the areas S1 and S2 corresponding to the dead spaces 50 and 52 and obtained in FIG. 5B are deleted as shown by broken lines from the rectangular circuit blocks 46 and 48, thereby forming the non-rectangular circuit blocks 40 and 42 having the non-rectangular areas.

After the non-rectangular circuit blocks 40 and 42 are formed as mentioned above, by allowing them to approach so that the portions of the deletion rectangular areas 54 and 56 are mutually fitted, a layout space of the non-rectangular circuit blocks 40 and 42 is reduced as shown in FIG. 6B, thereby allowing a region of a lateral width W1 of chip 38 that is necessary in the rectangular circuit block in FIG. 6A to be handled as a rectangular circuit block. Thus, a lateral width W2 can be decreased. If the area of the chip can be reduced as mentioned above, the manufacturing costs can be reduced in correspondence to it and a low price of the LSI can be realized.

Figure 7:
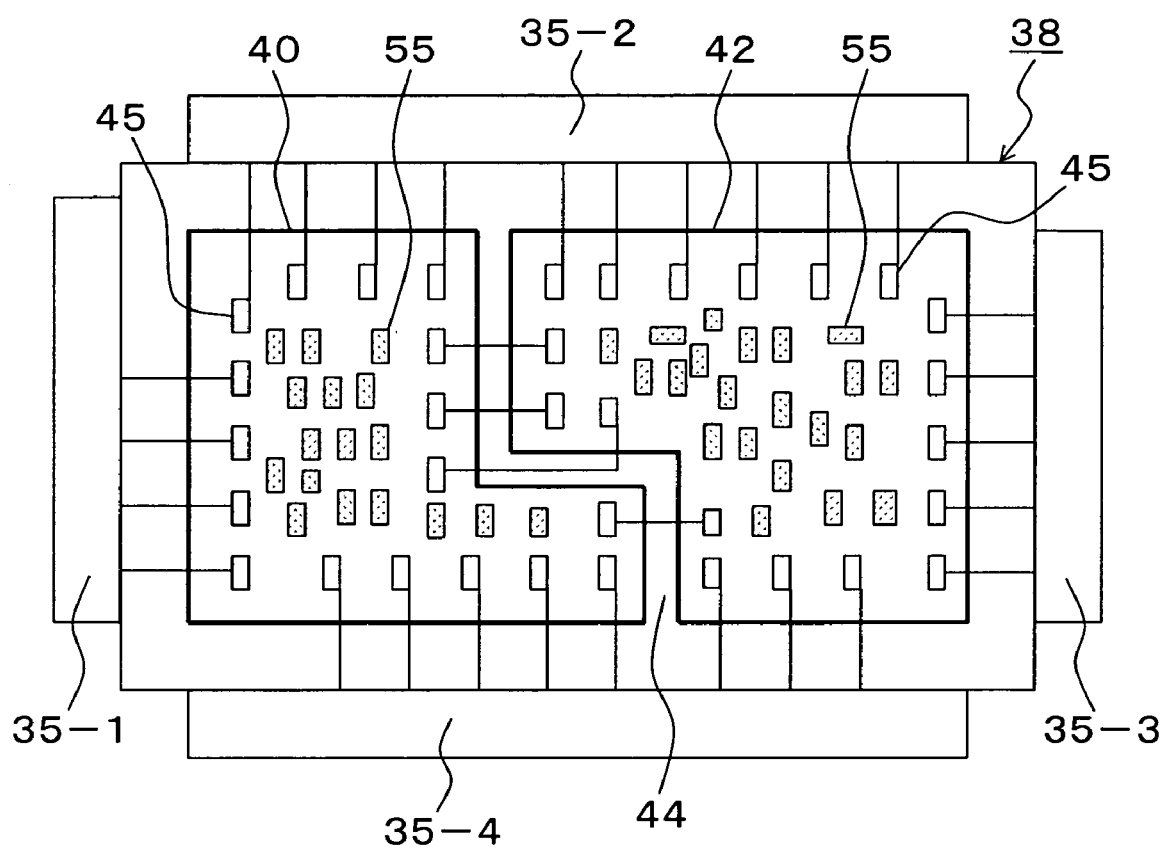
FIG. 7 is an explanatory diagram of the state where, with respect to a chip in which the non-rectangular areas in FIG. 4A have been arranged, further, external pins are arranged, the circuit blocks are mutually wired, and the cells are arranged.

FIG. 7 is an explanatory diagram of the state where, with respect to the chip in which the non-rectangular areas in FIG. 4A have been arranged, further, external pins are arranged, the circuit blocks are mutually wired, and the cells are arranged. In FIG. 7, external pins 35-1 to 35-4 are arranged around the chip 38. In correspondence to them, terminals 45 are arranged to the non-rectangular circuit blocks 40 and 42. The external pins 35-1 to 35-4 and the terminals 45 are wired and the terminals 45 of the non-rectangular circuit blocks 40 and 42 are wired through the wiring area 44. Subsequently, cells 55 are arranged in each of the non-rectangular circuit blocks 40 and 42. After the cells 55 are arranged, a wiring process of the cells 55 in the block is executed. The layout and wiring of the cells 55 in the non-rectangular circuit blocks 40 and 42 can be executed as parallel processes with respect to each of the circuit blocks.

Figure 8:
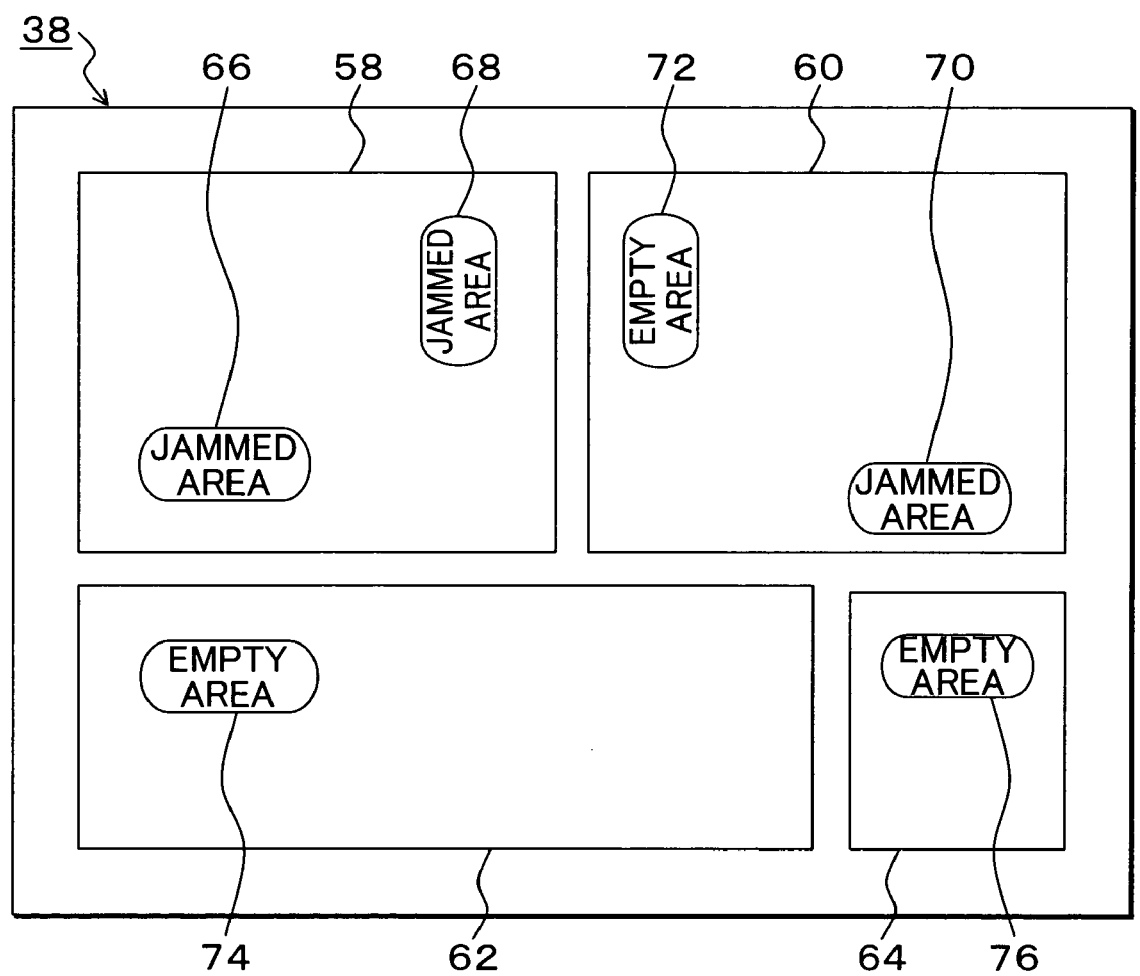
FIG. 8 is a layout explanatory diagram of rectangular circuit blocks having jammed areas and empty areas which are used to form the non-rectangular area according to the invention.

FIG. 8 is a layout explanatory diagram of rectangular circuit blocks having jammed areas and empty areas which are used to form the non-rectangular area according to the invention. In FIG. 8, rectangular circuit blocks 58, 60, 62, and 64 are arranged in accordance with the floor plan. By estimating the layout wiring of the cells in the rectangular circuit blocks 58, 60, 62, and 64, local jammed areas 66, 68, and 70 and empty areas 72, 74, and 76 are presumed. The jammed area 66 of the rectangular circuit block 58 faces the empty area 74 of the rectangular circuit block 62. The jammed area 68 of the rectangular circuit block 58 faces the empty area 77 of the rectangular circuit block 60. Further, the jammed area 70 of the rectangular circuit block 60 faces the empty area 76 of the rectangular circuit block 64. Therefore, with respect to the set of the jammed area and the empty area (which face each other) of the adjacent rectangular circuit blocks, by increasing the area of the rectangular circuit block side having the jammed area and by decreasing the area of the rectangular circuit block side having the empty area, a degree of jam of the jammed area is eliminated.

Figure 9A:
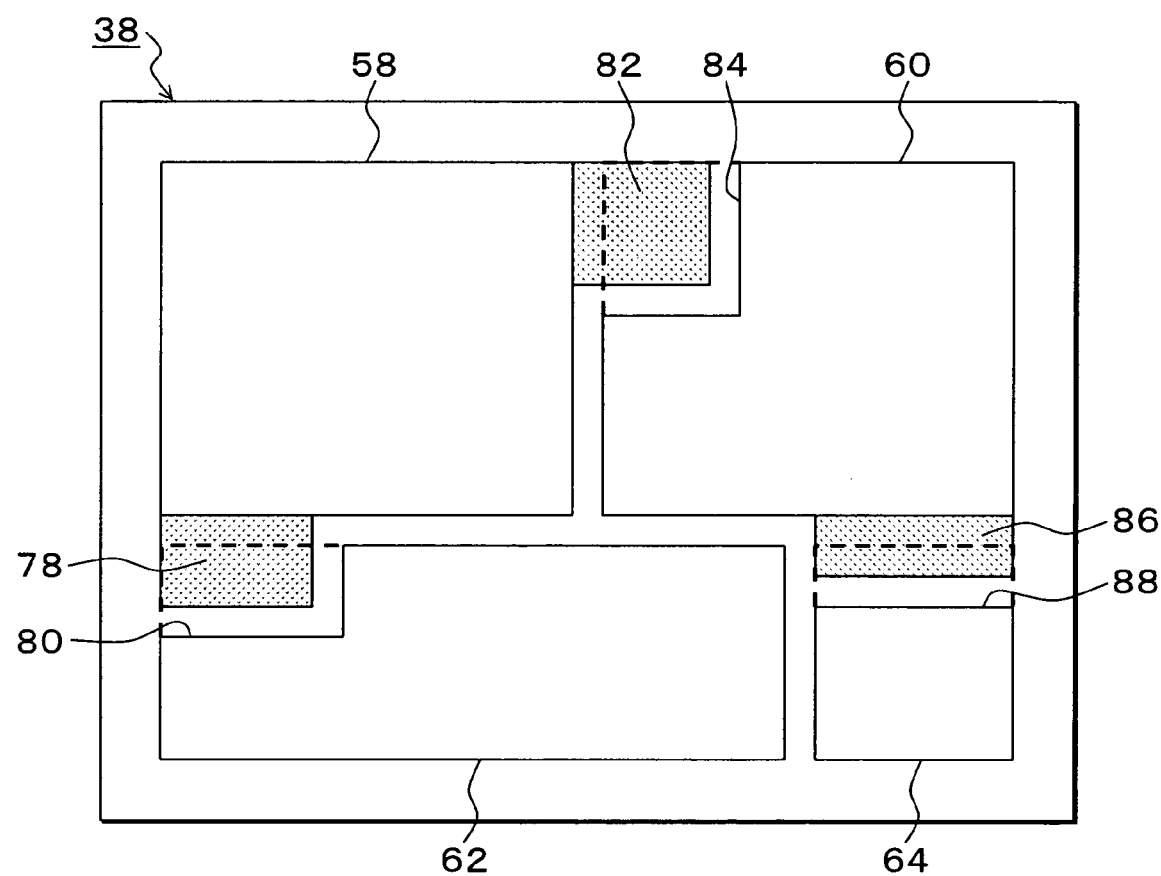
FIGS. 9A and 9B are explanatory diagrams of non-rectangular areas according to the invention formed on the basis of the jammed areas and the empty areas in FIG. 8.
Figure 9B:
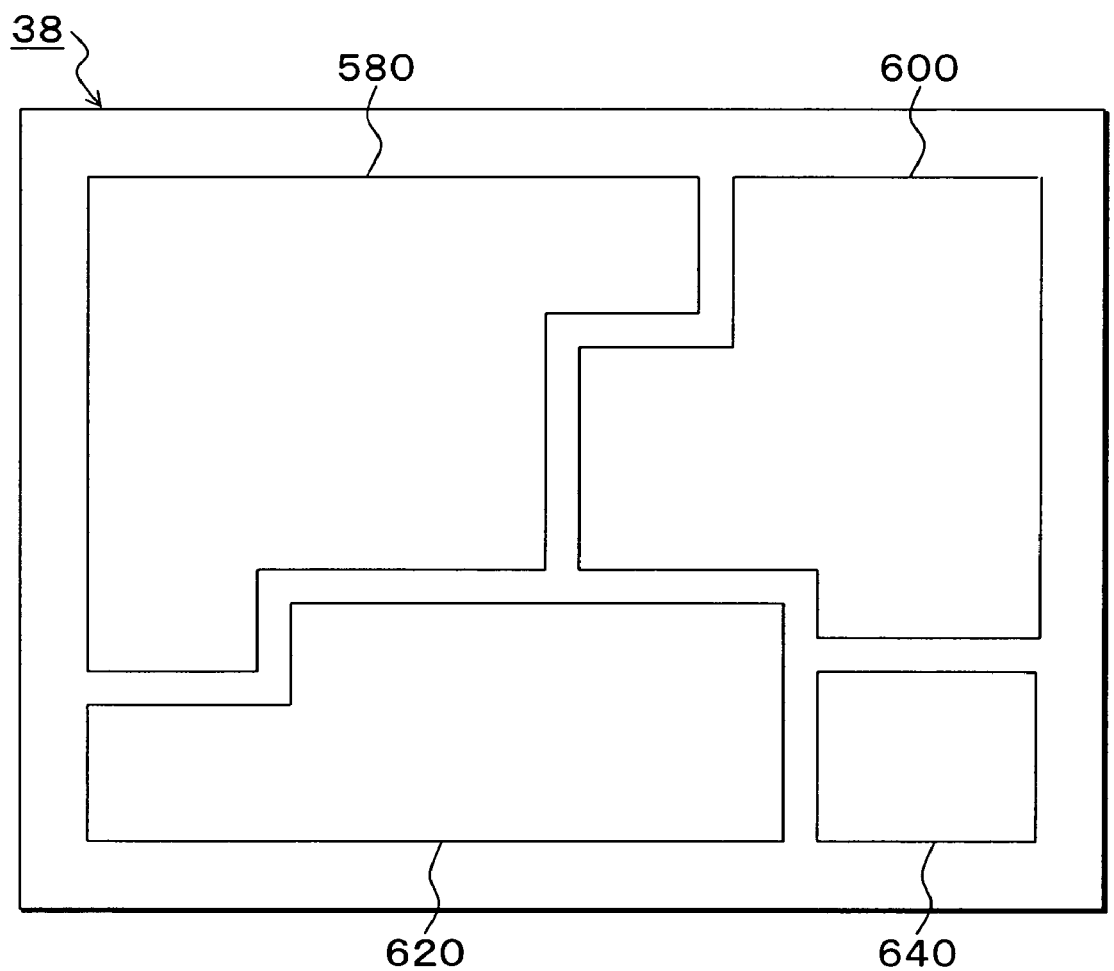

In FIG. 9A, on the basis of the jammed area 66 and the empty area 74, a rectangular expansion area 78 is added to the rectangular circuit block 58 and, in correspondence to it, a rectangular deletion area 80 is deleted from the rectangular circuit block 62. In correspondence to the jammed area 68 and the empty area 72, a rectangular expansion area 82 is added to the rectangular circuit block 58 and a deletion rectangular area 84 is deleted from the rectangular circuit block 60. Further, in correspondence to the jammed area 70 and the empty area 76, a rectangular expansion area 86 is added to the rectangular circuit block 60 and a deletion rectangular area 88 is deleted from the rectangular circuit block 62. By the expansion and deletion of the rectangular areas corresponding to the jammed area and the empty area, as shown in FIG. 9B, non-rectangular circuit blocks 580, 600, and 620 having non-rectangular areas can be obtained and a rectangular circuit block 640 in which an area of the rectangular area has been reduced can be obtained. The degree of jam of the jammed area can be eliminated.

That is, in the conventional physical design which handles only the rectangular areas, it is necessary to enlarge the chip area in order to eliminate the jammed area. However, in the invention, by searching the jammed area and the empty area in the adjacent rectangular areas, the rectangular area corresponding to the empty area is added to the rectangular circuit block having the jammed area, thereby changing the rectangular circuit block to the non-rectangular circuit block. Thus, the degree of jam of the jammed area can be eliminated without increasing the chip area.

Figure 10A:
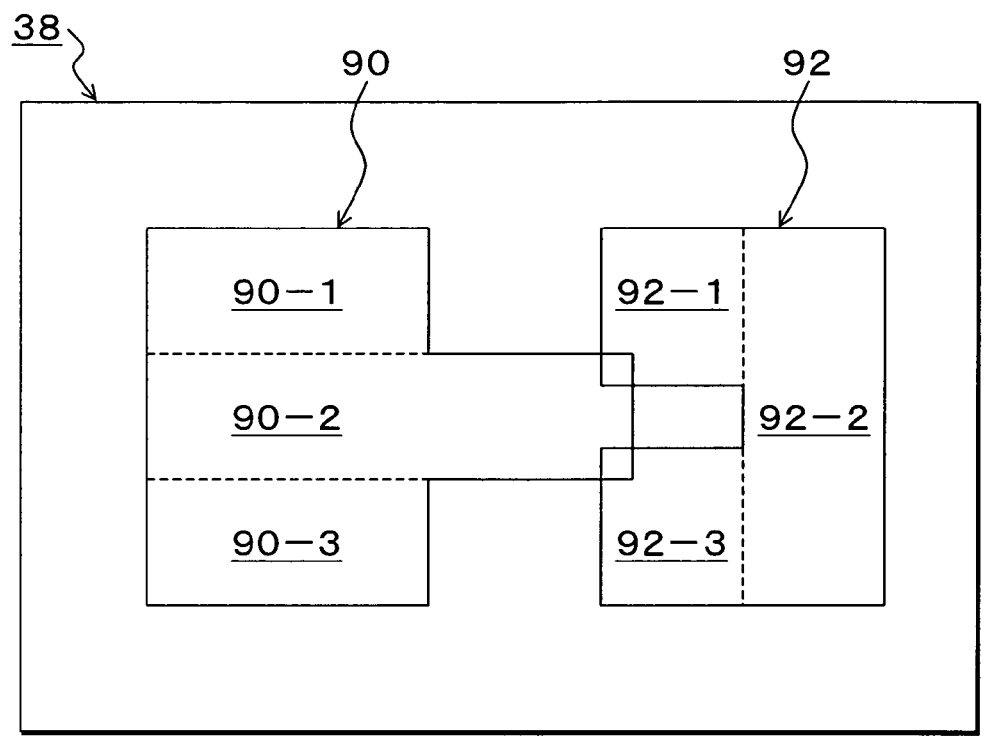
FIGS. 10A and 10B are explanatory diagrams for an overlap check in the case where the non-rectangular areas are arranged in a chip in the invention.
Figure 10B:
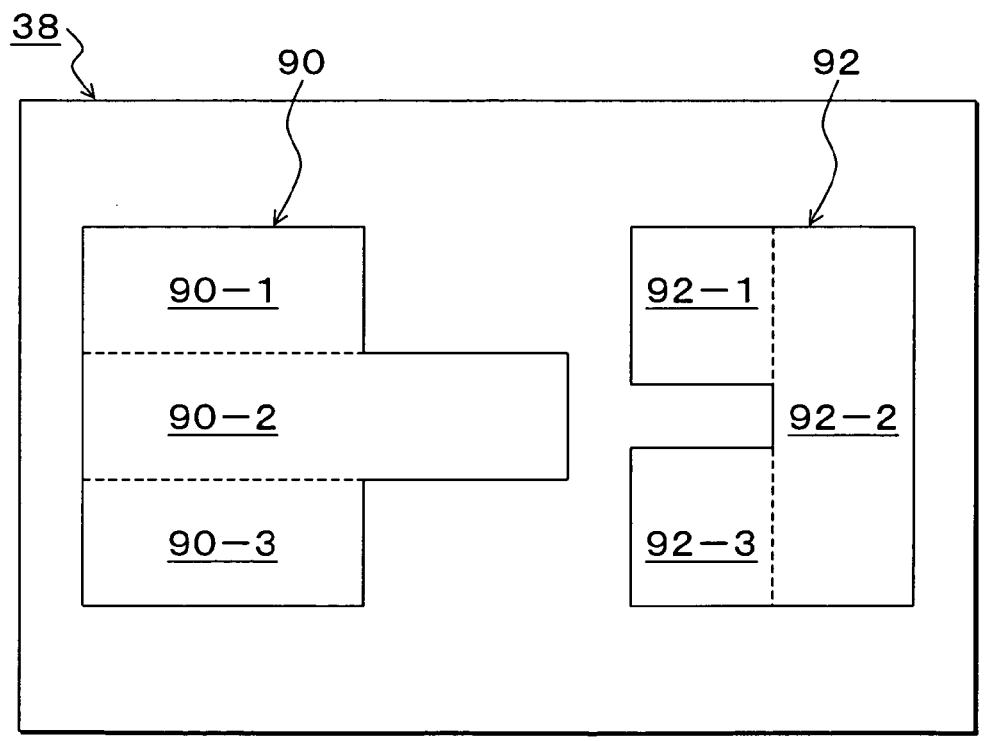

FIGS. 10A and 10B are explanatory diagrams for an overlap check in the case where circuit blocks having non-rectangular areas are arranged in a chip in the invention. FIG. 10A shows the case where non-rectangular circuit blocks 90 and 92 having non-rectangular areas are arranged in the chip 38 and they are arranged so that a part of them overlap each other. With respect to an overlap check in such a case, the non-rectangular circuit blocks 90 and 92 are divided into division rectangular areas 90-1 to 90-3 and 92-1 to 92-3. The overlap check about the rectangular areas is made among the division rectangular areas 90-1 to 90-3 and the division rectangular areas 92-1 to 92-3. If some of the division rectangular areas overlap each other, it is determined that the non-rectangular circuit blocks 90 and 92 overlap each other.

In such a case, since the division rectangular areas 92-1 and 92-3 overlap the division rectangular area 90-2, it is determined that the non-rectangular circuit blocks 90 and 92 overlap each other. If the overlap is discriminated, as shown in FIG. 10B, a spacing condition between the non-rectangular circuit blocks 90 and 92 is widened, the circuit blocks are arranged and the overlap check is made again, thereby eliminating the overlap of the circuit blocks.

Naturally, as shown in FIGS. 10A and 10B, when the non-rectangular circuit blocks 90 and 92 are arranged in the chip 38, for example, when considering the non-rectangular circuit block 90, since its data structure is constructed by the set of the three division rectangular areas 90-1 to 90-3, first, the division rectangular area 90-1 is arranged, subsequently, the division rectangular area 90-2 is arranged, and the division rectangular area 90-2 is finally arranged. In this manner, the same arranging process as the ordinary layout of the rectangular circuit blocks is repeated.

Figure 11:
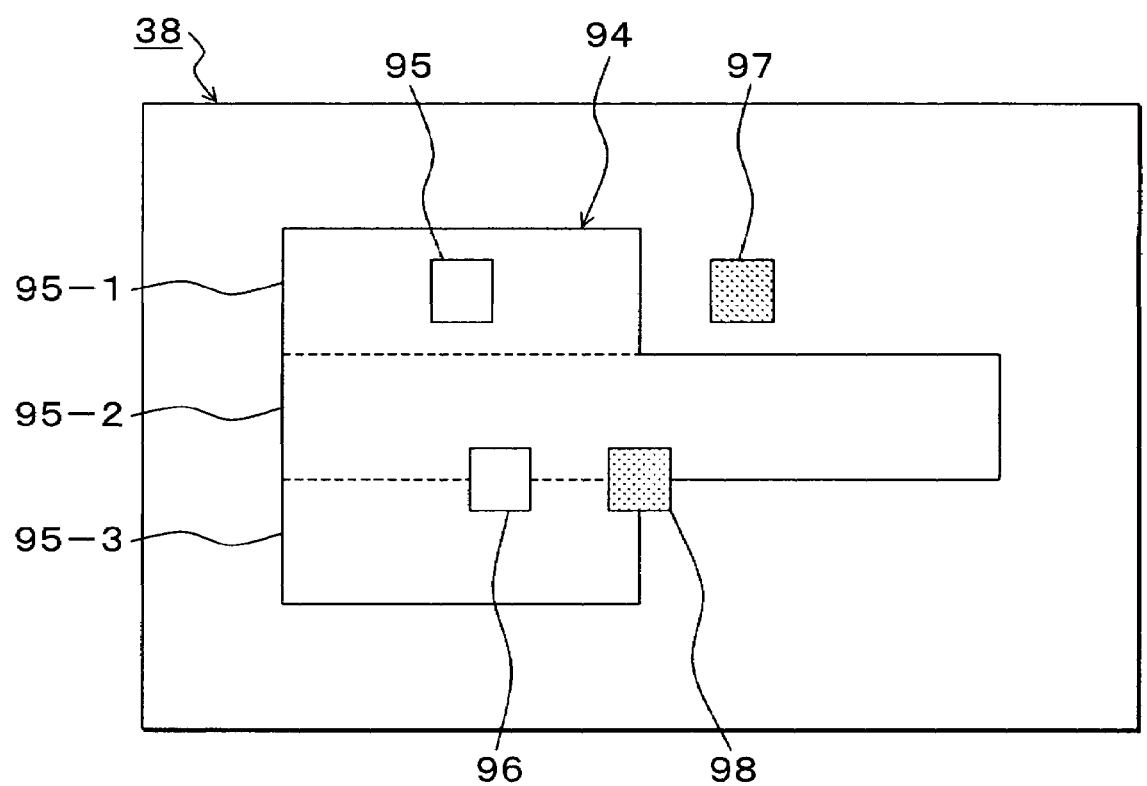
FIG. 11 is an explanatory diagram for a check about whether or not cells enter an area in the case where a circuit block having a non-rectangular area according to the invention is arranged.

FIG. 11 is an explanatory diagram for a check about whether or not cells enter the area in the case where it has been arranged in a circuit block having a non-rectangular area according to the invention. In FIG. 11, a non-rectangular circuit block 94 having a non-rectangular area is arranged in the chip 38 and cells 95, 96, 97, and 98 are arranged in the non-rectangular circuit block 94. All of the cells 95 to 98 have to be arranged in the non-rectangular circuit block 94.

As for a check about such a cell layout as well, the non-rectangular circuit block 94 is divided into three division rectangular areas 95-1, 95-2, and 95-3 and a check about whether or not the cells 95 to 98 are included in the block is made with regard to each of the division rectangular areas 95-1 to 95-3.

In the check about whether or not the cells are included in the block, the following checks are made.

(1) If the cells are included in any one of the division rectangular areas, they are included in the non-rectangular circuit block.
(2) If the cells are included in a plurality of division rectangular areas, they are included in the non-rectangular circuit block.
(3) If the cells are not included in any one of the division rectangular areas, they are not included in the non-rectangular circuit block.
(4) If a part of the cells are included in one or any one of the plurality of division rectangular areas, they are not included in the non-rectangular circuit block.

When this check rule is applied to FIG. 11, since the cell 95 is included in the division rectangular area 95-1, it is included in the non-rectangular circuit block 94. Since the cell 96 is included in both of the division rectangular areas 95-1 and 95-2, it is included in the non-rectangular circuit block 94. Since the cell 97 is not included in any one of the division rectangular areas 95-1 to 95-3, it is not included in the non-rectangular circuit block 94. Further, since a part of the cell 98 is included in the division rectangular areas 95-2 and 95-3, it is not included in the non-rectangular circuit block 94. Therefore, with respect to the two cells 97 and 98, since the arranging process to the inside of the non-rectangular circuit block 94 failed, the cell layout is retried.

Figure 12A:
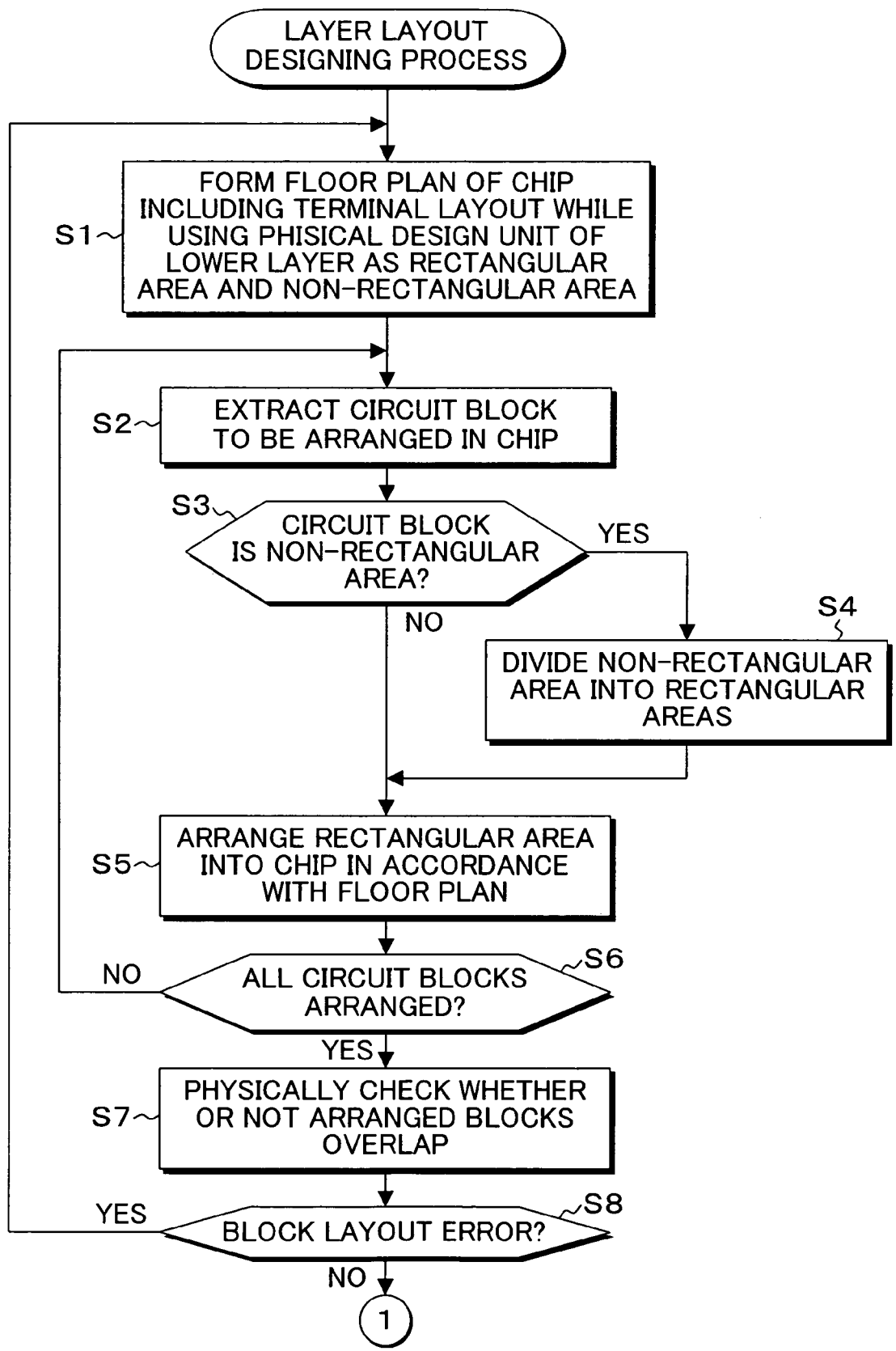
FIGS. 12A and 12B are flowcharts for a layer layout process according to the invention which handles the circuit block having the non-rectangular area.
Figure 12B:
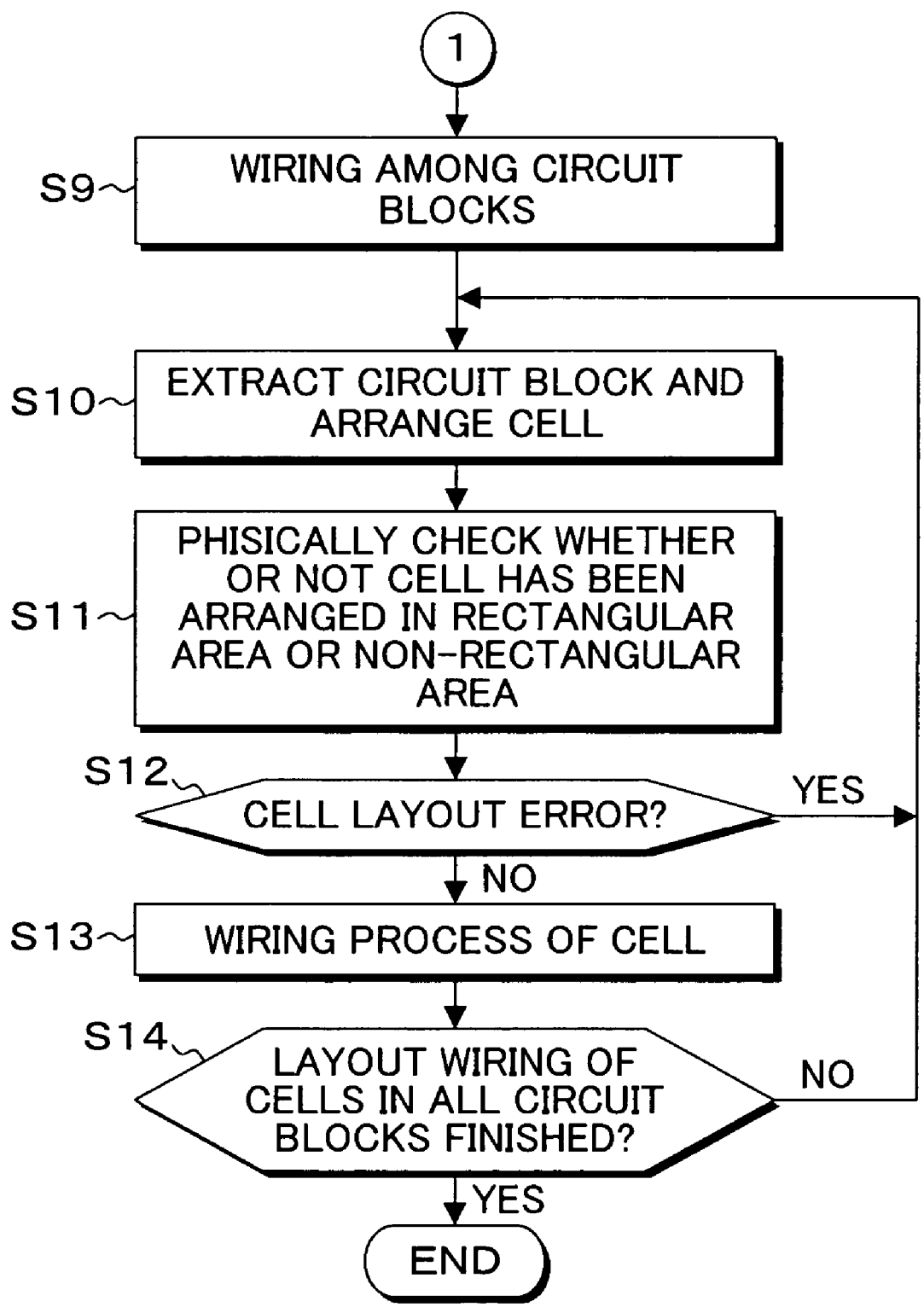

FIGS. 12A and 12B are flowcharts for a layer layout designing process according to the invention which handles the circuit block of the non-rectangular area and the top-down type will be mentioned as an example. In FIGS. 12A and 12B, in step S1, the physical design units serving as lower layers of the chip, specifically speaking, the circuit blocks are set to the rectangular area and the non-rectangular area and the floor plan of the chip including the terminal layout is formed. Subsequently, in step S2, one circuit block which is arranged in the chip is extracted on the basis of the floor plan. In step S3, whether or not this circuit block has the non-rectangular area is discriminated. In the case of the circuit block of the rectangular area, step S5 follows and the rectangular area is arranged in the chip in accordance with the floor plan. If this circuit block has the non-rectangular area, step S4 follows and the non-rectangular area is divided into a plurality of rectangular areas and, thereafter, step S5 follows. The divided rectangular areas are sequentially arranged in the chip.

Subsequently, in step S6, whether or not all circuit blocks have been arranged are discriminated. If the circuit block remains, the processing routine is returned to step S2. If the layout of all of the circuit blocks is finished, step S7 follows. In step S7, a physical check to see if the circuit blocks arranged in the chip overlap each other is made. In this case, with respect to the non-rectangular circuit block having the non-rectangular area, as shown in FIG. 11, the non-rectangular area is divided into a plurality of rectangular areas and the overlap is checked. If a block layout error in which the blocks overlap is discriminated in step S8 as a result of the physical check, the processing routine is returned to the floor plan of step S1 and the processes are retried. If no block layout error is discriminated in step S8, step S9 follows and the circuit blocks which have already been arranged are wired. Upon wiring in this instance, the wiring to the external pins is also simultaneously made.

Subsequently, in step S10, one circuit block which has already been arranged in the chip is extracted and cells are arranged. Also with respect to such a cell layout, with respect to the shape of cell to be arranged in the circuit block, in the invention, in addition to the conventional cell of the rectangular area, the cell having the non-rectangular area can be arranged. After the cell layout, in step S11, a physical check to see if the cells have been arranged in the circuit block having the rectangular area or the non-rectangular area is made. In this physical check, with respect to the non-rectangular area, as shown in FIG. 11, the non-rectangular area is divided into a plurality of rectangular areas and the check is made. If a cell layout error in which the cells cannot be arranged in the circuit block is discriminated in step S12, the processing routine is returned to step S10 and the cell layout is retried. If there is no cell layout error, step S13 follows and the wiring process of the cells is executed. Subsequently, in step S14, whether or not the wiring of the cell layout of all of the circuit block has been finished is discriminated. If it is no finished, the processing routine is returned to step S10, the next circuit block is extracted, and the wiring of the cell layout is similarly repeated. If the wiring of the cell layout of all of the circuit block is finished, a series of processes is finished.

Figure 13:
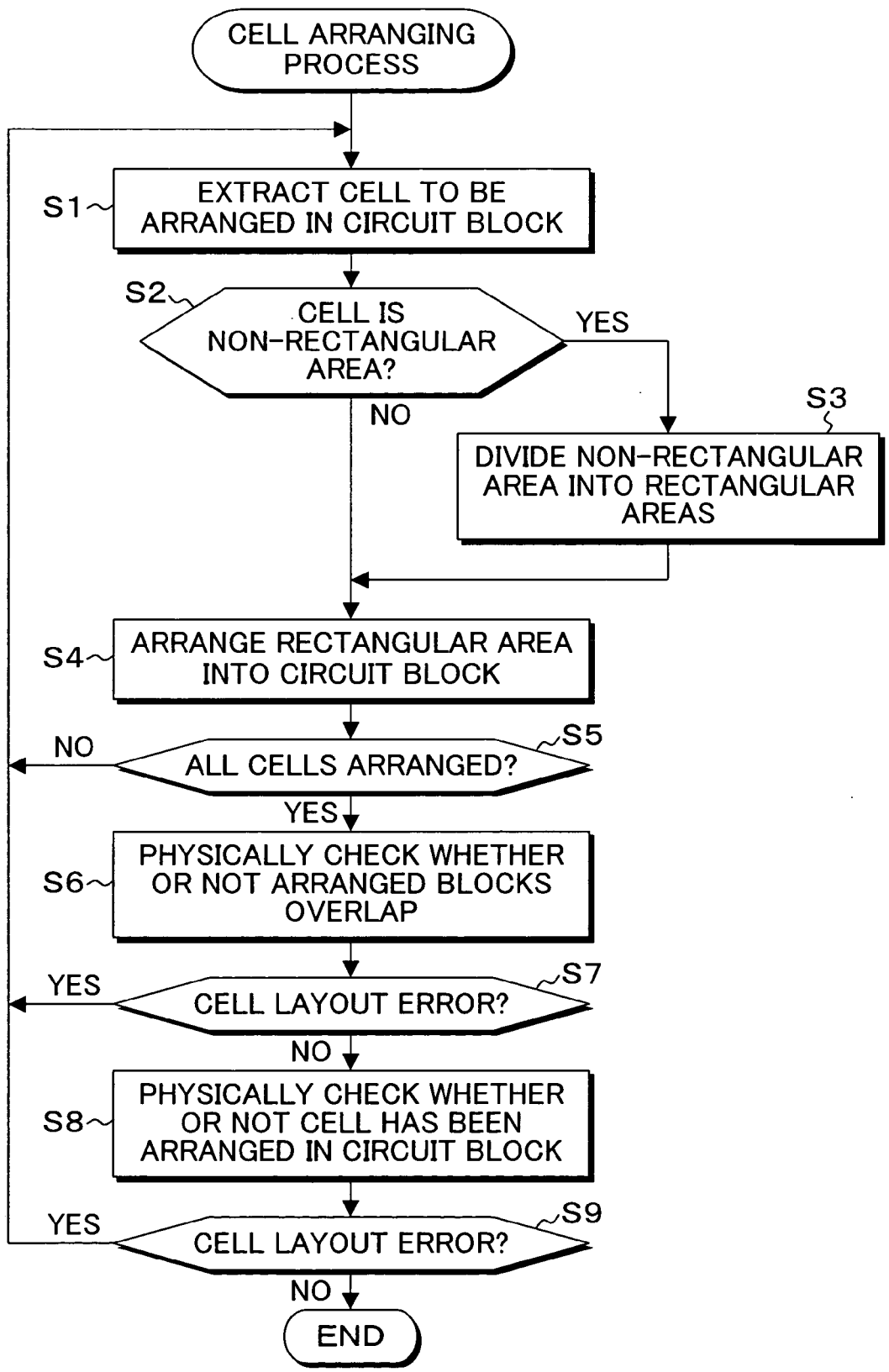
FIG. 13 is a flowchart for a cell arranging process according to the invention which handles a cell of the non-rectangular area.

FIG. 13 is a flowchart for a cell arranging process according to the invention which handles the cell of the non-rectangular area. In FIG. 13, in the cell arranging process, the cells which are arranged in the circuit block are extracted in step S1. Whether or not the cell has the non-rectangular area is discriminated in step S2. If the cell has the rectangular area, step S4 follows and the cell of the rectangular area is arranged in the circuit block. In the case of the cell having the non-rectangular area, step S3 follows and the non-rectangular area of the cell is divided into a plurality of division rectangular areas. After that, a plurality of divided rectangular areas are sequentially arranged in the circuit block in step S4.

Such processes of steps S1 to S4 are repeated until all cells are arranged in step S5. If the layout of all of the cells is finished, a physical check about whether or not the arranged cells overlay is made in step S6. In this case, with respect to the cell having the non-rectangular area, as shown in FIGS. 10A and 10B, it is divided into a plurality of rectangular areas and the overlap is discriminated. If the cell layout error in which the cells overlap is discriminated in step S7, the processing routine is returned to step S1 and the processes are executed again from the creation of the cells. If there is no cell layout error in step S7, step S8 follows and a physical check to discriminate whether or not the cell has been arranged in the circuit block is made. In this physical check, if the circuit block has the non-rectangular area, as shown in FIG. 11, it is divided into a plurality of rectangular areas and whether or not the cells are included in the block is discriminated. If the cell is not included in the circuit block and the cell layout error occurs in step S9, the processing routine is returned to step S1 and the processes are retried. If there is no cell layout error, a series of processes is finished.

As for the arranging process of the cell having the non-rectangular area, by replacing the portion of steps S10 to S12 in the layer layout designing process in FIGS. 12A and 12B by the cell arranging process in FIG. 13, the layer layout design which handles the non-rectangular area can be made with respect to both of the circuit block and the cell.

In the creation of the cell having the non-rectangular area which is used in the arranging process in FIG. 13, with respect to the creation of the non-rectangular area based on the dead space of the rectangular area shown in FIGS. 5A, 5B, 6A, and 6B or the creation of the non-rectangular area based on the jammed area and the empty area shown in FIGS. 8, 9A, and 9B, by replacing the process at the circuit block level by the process at the cell level, it can be similarly applied.

Although the layer layout process in FIGS. 12A and 12B has been described with respect to the top-down type as an example, it is also possible to cope with the bottom-up type by similarly handling the circuit block having the non-rectangular area and the cell having the non-rectangular area according to the invention. Further, the invention provides an LSI physical designing program and this program has processing procedures according to the flowcharts shown in FIGS. 12A and 12B and FIG. 13.

Although the foregoing embodiment has been described with respect to the layer layout design as an LSI physical design as an example, in the case of using a method whereby the chip is divided into the layer modules and the layout design is made, the invention which handles the physical design unit as a non-rectangular area is directly applied to the proper layout design.

The invention is not limited to the foregoing embodiments but incorporates other proper modifications without losing its objects and advantages. Further, the invention is not limited by the numerical values shown in the above embodiments of the invention.

What is claimed is:

1. An LSI physical designing method comprising:
   a floor plan processing step wherein a floor plan for arranging a plurality of circuit blocks, including a circuit block of a non-rectangular area, in a chip is formed;
   a layout step wherein the circuit block of said non-rectangular area is divided into a plurality of rectangular areas that are arranged in said chip so as to be adapted to said floor plan; and
   a wiring step wherein said plurality of circuit blocks, including the circuit block of said non-rectangular area divided into the plurality of rectangular areas, having been arranged in said chip, are mutually wired,
   wherein in said floor plan processing step, after the plurality of circuit blocks, including the circuit block of the non-rectangular area divided into the plurality of rectangular areas, are arranged in said chip, a pair of adjacent circuit blocks having empty areas are searched, a self rectangular empty area is deleted from a part of an opposite side of one of said circuit blocks, a self rectangular empty area is deleted from a residual portion of an opposite side of the other circuit block, and a pair of non-rectangular areas having concave/convex fitting shapes are formed.

2. A method according to claim 1, wherein said non-rectangular area has a data structure showing a set of two-dimensional coordinate values indicating diagonal vertices of the divided, plurality of rectangular areas.

3. An LSI physical designing method comprising:
   a floor plan processing step wherein a floor plan for arranging a plurality of circuit blocks, including a circuit block of a non-rectangular area, in a chip is formed;
   a layout step wherein the circuit block of said non-rectangular area is divided into a plurality of rectangular areas that are arranged in said chip so as to be adapted to said floor plan; and
   a wiring step wherein said plurality of circuit blocks, including the circuit block of said non-rectangular area divided into the plurality of rectangular areas, having been arranged in said chip, are mutually wired,
   wherein in said floor plan processing step, after the plurality of circuit blocks, including the circuit block of the non-rectangular area divided into the plurality of rectangular areas, are arranged in said chip, a pair of adjacent circuit blocks having a jammed area and an empty area are searched, a rectangular area is added to a part of an opposite side of the circuit block having the jammed area, a shape corresponding to said added rectangular area is deleted from a portion of an opposite side of the circuit block having the empty area, and a pair of non-rectangular areas having concave and convex fitting shapes are formed.

4. A method according to claim 3, wherein in said layout step, in a case where at least one of the divided plurality of rectangular areas overlaps a divided rectangular area of another non-rectangular area, it is determined that said two non-rectangular areas overlap each other, and the overlap is eliminated by re-layout.

5. A method according to claim 3, further comprising:
a cell layout step wherein cells are arranged in the circuit block having said non-rectangular area,
and wherein in said cell layout step,
when said arranged cells are included in one or a plurality of the divided rectangular areas, it is determined that the arranged cells are included in said non-rectangular area, and
when the arranged cells are not included in any one of the divided rectangular areas, it is determined that said cells are not included in said non-rectangular area.

6. A method according to claim 3, wherein in said layout step, cells are arranged in the circuit block of the non-rectangular area.

7. A computer-readable storacie medium which stores an LSI physical designing program allowing a computer to execute:
a floor plan processing step wherein a floor plan for arranging a plurality of circuit blocks, including a circuit block of a non-rectangular area, in a chip is formed;
a layout step wherein the circuit block of said non-rectangular area is divided into a plurality of rectangular areas that are arranged in said chip so as to be adapted to said floor plan; and
a wiring step wherein the plurality of circuit blocks, including the circuit block of said non-rectangular area divided into the plurality of rectangular areas, having been arranged in said chip, are mutually wired,
wherein in said floor plan processing step, after the plurality of circuit blocks, including the circuit block of the non-rectangular area divided into the plurality of rectangular areas, are arranged in said chip, a pair of adjacent circuit blocks having empty areas are searched, a self rectangular empty area is deleted from a part of an opposite side of one of said circuit blocks, a self rectangular empty area is deleted from a residual portion of an opposite side of the other circuit block, and a pair of non-rectangular areas having concave/convex fitting shapes are formed.

8. Computer-readable storage medium according to claim 7, wherein said non-rectangular area has a data structure showing a set of two-dimensional coordinate values indicating diagonal vertices of the divided plurality of rectangular areas.

9. A computer-readable storage medium which stores an LSI physical designing program allowing a computer to execute:
a floor plan processing step wherein a floor plan for arranging a plurality of circuit blocks, including a circuit block of a non-rectangular area, into a chip is formed;
a layout step wherein the circuit block of said non-rectangular area is divided into a plurality of rectangular areas that are arranged in said chip so as to be adapted to said floor plan; and
a wiring step wherein the plurality of circuit blocks, including the circuit block of said non-rectangular area divided into the plurality of rectangular areas, having been arranged in said chip, are mutually wired,
wherein in said floor plan processing step, after the plurality of circuit blocks, including the circuit block of the non-rectangular area divided into the plurality of rectangular areas, are arranged in said chip, a pair of adjacent circuit blocks having a jammed area and an empty area are searched, a rectangular area is added to a part of an opposite side of the circuit block having the jammed area, a shape corresponding to said added rectangular area is deleted from a portion of an opposite side of the circuit block having the empty area, and a pair of non-rectangular areas having concave and convex fitting shapes are formed.

10. A computer-readable storage medium according to claim 9, wherein in said layout step, in the case where at least one of the divided plurality of rectangular areas overlaps divided rectangular area of another non-rectangular area, it is determined that said two non-rectangular areas overlap each other, and the overlap is eliminated by re-layout.

11. A computer-readable storage medium according to claim 9, wherein the LSI physical designing program further allows a computer to execute:
a cell layout step wherein cells are arranged in the circuit block having said non-rectangular area,
and wherein in said cell layout step,
when said arranged cells are included in one or a plurality of the divided rectangular areas, it is determined that the arranged cells are included in said non-rectangular area, and
when the arranged cells are not included in any one of the plurality of divided rectangular areas, it is determined that said arranged cells are not included in said non-rectangular area.

12. A computer-readable storage medium according to claim 9, wherein in said layout step, cells are arranged in the circuit block having the non-rectangular area.

13. An LSI physical designing apparatus comprising:
a floor plan processing unit which forms a floor plan for arranging a plurality of circuit blocks, including a circuit block of a non-rectangular area, in a chip;
a layout processing unit which divides the circuit block of the non-rectangular area into a plurality of rectangular areas and arranges said divided rectangular areas in said chip so as to be adapted to said floor plan; and
a wiring processing unit which mutually wires the plurality of circuit blocks, including the circuit block having said non-rectangular area divided into the plurality of rectangular areas, having been arranged in said chip,
wherein after the plurality of circuit blocks, including the circuit block of the non-rectangular area divided into the plurality of the rectangular areas, are arranged in said chip, said floor plan processing unit searches for a pair of adjacent circuit blocks having empty areas, deletes a self rectangular empty area from a part of an opposite side of one of said circuit blocks, deletes a self rectangular empty area from a residual portion of an opposite side of the other circuit block, and forms a pair of non-rectangular areas having concave/convex fitting shapes.

14. An apparatus according to claim 13, wherein said non-rectangular area has a data structure showing a set of two-dimensional coordinate values indicating diagonal vertices of said divided plurality of rectangular areas.

15. An LSI physical designing apparatus comprising:
a floor plan processing unit which forms a floor plan for arranging a plurality of circuit blocks, including a circuit block of a non-rectangular area, in a chip;
a layout processing unit which divides the circuit block of the non-rectangular area into a plurality of rectangular areas and arranges said rectangular areas into said chip so as to be adapted to said floor plan; and a wiring processing unit which mutually wires the plurality of circuit blocks, including the circuit block having said non-rectangular area divided into the plurality of rectangular areas, having been arranged in said chip, wherein after the plurality of circuit blocks, including the circuit block of the non-rectangular area divided into the plurality of rectangular areas, are arranged in said chip, said floor plan processing unit searches for a pair of adjacent circuit blocks having a jammed area and an empty area, adds a rectangular area to a part of an opposite side of the circuit block having the jammed area, deletes a shape corresponding to said added rectangular area from a portion of an opposite side of the circuit block having the empty area, and forms a pair of non-rectangular areas having concave and convex fitting shapes.

16. An apparatus according to claim 15, wherein said layout processing unit, in the case where at least one of the divided plurality of rectangular areas overlaps a divided rectangular area of another non-rectangular area, determines that said two non-rectangular areas overlap each other, and eliminates the overlap by re-layout.

17. An apparatus according to claim 15, further comprising:

a cell layout processing unit which arranges cells into the circuit block having said non-rectangular area, and wherein said cell layout processing unit determines that said arranged cells are included in said non-rectangular area when said arranged cells are included in one or a plurality of the divided rectangular areas, and determines that said arranged cells are not included in said non-rectangular area when said arranged cells are not included in any one of the plurality of divided rectangular areas.

18. An apparatus according to claim 15, wherein said layout processing unit arranges cells into the circuit block having the non-rectangular area.

* * * * *

UNITED STATES PATENT AND TRADEMARK OFFICE
CERTIFICATE OF CORRECTION

PATENT NO. : 7,308,667 B2  Page 1 of 1
APPLICATION NO. : 11/062594
DATED : December 11, 2007
INVENTOR(S) : Hideaki Katagiri It is certified that error appears in the above-identified patent and that said Letters Patent is hereby corrected as shown below:

Col. 13, line 19, delete "storacie" and insert --storage-- therefor.

Col. 13, line 45, delete "Computer-readable" and insert --A computer-readable--, therefor.

Col. 14, line 13, after "overlaps" insert --a--.

Signed and Sealed this

Sixth Day of May, 2008

JON W. DUDAS
*Director of the United States Patent and Trademark Office*